US005703496A

United States Patent [19]
Sabin

[11] Patent Number: 5,703,496
[45] Date of Patent: Dec. 30, 1997

[54] METHOD AND APPARATUS FOR LIMITING THE SLEW RATE OF OUTPUT DRIVERS BY SELECTIVELY PROGRAMMING THE THRESHOLD VOLTAGE OF FLASH CELLS CONNECTED THERETO

[75] Inventor: Gregory D. Sabin, Phoenix, Ariz.

[73] Assignee: Intel Corporation, Santa Clara, Calif.

[21] Appl. No.: 623,412

[22] Filed: Mar. 28, 1996

Related U.S. Application Data

[63] Continuation-in-part of Ser. No. 534,256, Sep. 26, 1995, Pat. No. 5,638,007.

[51] Int. Cl.$^6$ ............................................. H03K 19/0948
[52] U.S. Cl. ........................... 326/27; 326/50; 326/87; 327/170
[58] Field of Search ........................... 326/27, 83, 86–87, 326/121, 17, 38, 44; 327/170

[56] References Cited

U.S. PATENT DOCUMENTS

| | | | |
|---|---|---|---|
| 4,959,564 | 9/1990 | Steele | 326/44 |
| 5,039,874 | 8/1991 | Anderson | 327/170 |
| 5,194,765 | 3/1993 | Dunlop et al. | 326/87 |
| 5,387,824 | 2/1995 | Michelsen | 326/83 |
| 5,489,858 | 2/1996 | Pierce et al. | 326/83 |
| 5,638,007 | 6/1997 | Sabin | 326/27 |

Primary Examiner—Edward P. Westin
Assistant Examiner—Jon Santamauro
Attorney, Agent, or Firm—Blakely, Sokoloff, Taylor & Zafman

[57] ABSTRACT

The output driver includes a plurality of transistor devices connected to an output line. In one arrangement, a separate flash-programmable element is connected to each of the plurality of transistor devices. Each of the separate flash elements receives the data signal along an input line and outputs the data signal if the flash cell is enabled (or not programmed) and outputs a constant voltage level, regardless of the data signal, if the flash element is not enabled. Hence, only those output transistors connected to flash elements that have been enabled are triggered by the output signal. Other transistors merely receive a constant voltage and are, therefore, not triggered regardless of the output signal. In another arrangement, the output driver is configured to forward output signals to all of the output transistors but the flash cells are programmed to adjust a time delay occurring prior to reception by the output transistors. This is achieved by setting the threshold voltage for the flash elements to differing values. The flash cells may be programmed to provide sequentially increasing time delays. Hence, the corresponding output transistors are activated sequentially resulting in a reduction in the increase of current drawn as a function of time, thereby reducing the total amount of voltage noise. In either arrangement, the various flash-programmable elements of the output drivers of the integrated circuit chip are programmed after fabrication of the chip.

17 Claims, 7 Drawing Sheets

METHOD AND APPARATUS FOR LIMITING THE SLEW RATE OF OUTPUT DRIVERS BY SELECTIVELY PROGRAMMING THE THRESHOLD VOLTAGE OF FLASH CELLS CONNECTED THERETO

RELATED APPLICATIONS

This application is a continuation-in-part of application Ser. No. 08/534,256, entitled "Method and Apparatus for Limiting the Slew Rate of Output Drivers of an Integrated Circuit by Using Programmable Flash Cells," by Gregory D. Sabin, filed Sep. 26, 1995 now U.S. Pat. No. 5,638,007.

BACKGROUND OF THE INVENTION

1. Field of the Invention

The invention generally relates to integrated circuits (ICs) and in particular to techniques for limiting the current slew rate of output drivers of an IC.

2. Description of Related Art

Typical ICs include a set of output drivers for driving signals provided by internal circuitry of the IC through output pads onto output transmission lines, which may be individual lines of an output bus. A typical output driver includes one or more transistors connected to a high voltage power supply and ground. Gates of the transistors are connected to internal lines providing the signals to be output. Often, the output transistors are connected in "complementary" pairs, with each pair having a PMOS transistor and NMOS transistor. An output of the driver appears on interconnected drains of the NMOS and PMOS transistors.

In use, a signal to be output is simultaneously applied to the gates of each of the PMOS transistors and each of the NMOS transistors. Outputs from the transistors are combined onto the single output line. To provide sufficient power for pulling up or pulling down the output line, which may be subject to a large external load, the output driver is typically provided with fairly large transistors connected to a power supply providing a significant amount of charge. Accordingly, when the input signal is applied to the gates of transistors, a significant current is quickly conducted through the transistors. Noise in the output signal, however, is directly proportional to the time rate of change of current, herein also referred to as the current "slew" rate. Accordingly, the faster the current increases from near 0 to an amount required for driving the output signal, the greater the noise in the output signal. Even greater noise occurs when the output signal is driven from high to low voltage. In this context, "noise" represents any deviation in the intended voltage of the output signal. If the deviation is significant, it may be difficult or impossible for an external device connected to the output line to properly receive the intended signal.

Figure 1:
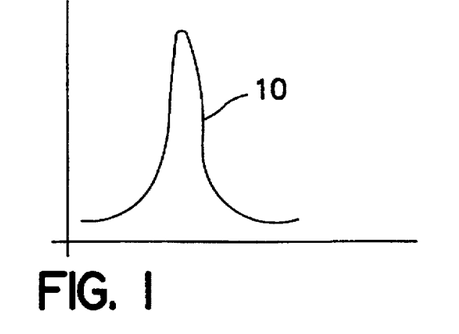
FIG. 1 is a graph illustrating the time rate of change of current drawn through the output transistors of the conventional output driver.

FIG. 1 illustrates the time rate of change of current drawn through the output transistors of such a conventional output driver. As can be seen, the current increases steeply than decreases steeply, resulting in a current spike 10, causing significant noise.

Figure 2:
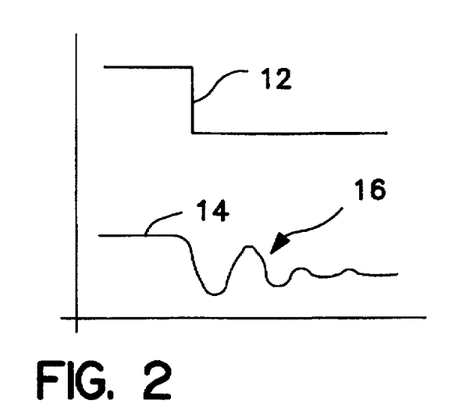
FIG. 2 is a graph illustrating an intended output signal and an actual output signal subject to significant voltage noise.

FIG. 2 illustrates a transition in an intended output signal 12 and an actual signal 14, subject to significant voltage noise. As can be seen, the output voltage varies or oscillates significantly, before being dampened. Large voltage swings, such as identified by reference 16, may be erroneously detected as a further transition in the output signal.

In practical systems, noise of the type illustrated in FIG. 2 occurs only if a large number of high-drive output drivers are triggered simultaneously causing a significant change in the total power supply current with respect to time. Accordingly, to avoid noise problems, many systems are merely configured to trigger only a certain maximum number of output drivers simultaneously, to thereby lower the overall time rate of change of current drawn from the power source and to thereby limit the amount of noise. For state of the art integrated circuits, however, it is frequently necessary to trigger a large number of output drivers simultaneously for use in, for example, driving a 32-bit bus at a high clock rate. Accordingly, techniques have been developed for reducing the current slew rate within at least some of the output drivers to allow a large number of the drivers to be triggered simultaneously while generating an acceptable amount of voltage noise.

Figure 3:
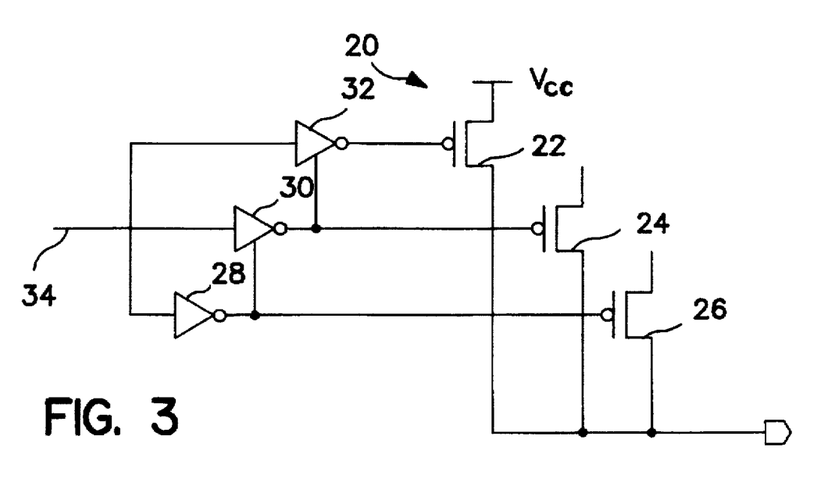
FIG. 3 is a schematic illustration of a conventional output driver configured with staggered inverters for reducing the current slew rate.

FIG. 3 illustrates the PMOS components of a conventional output driver configured to reduce the current slew rate. Output driver 20 includes a set of three separate output transistors 22, 24 and 26 interconnected to a set of three staggered inverters 28, 30 and 32. An input line 34 is connected into inputs of each of the inverters. An output of inverter 28 enables inverter 30. Likewise, an output of inverter 30 enables inverter 32. Accordingly, the three inverters output three versions of the input signal (inverted) with each being delayed or advanced with respect to the others.

The outputs of the three inverters are connected to the gates of transistors 22 through 26, respectively, such that three transistors are triggered at slightly different times. More specifically, transistor 26 is triggered first, then transistor 24, and finally transistor 22. By triggering the output transistors at slightly different times, the total time rate of change of current caused by activation of the output transistors is decreased, thus yielding lower voltage noise.

Although not shown, output driver 20 also includes a set of NMOS transistors and a set of corresponding staggered inverters, interconnected as a mirror image of the components shown in FIG. 2. Also, although not separately shown, each of transistors 22, 24 and 26 may represent an entire set of transistors. In other words, a set of, for example, four or five output transistors may be connected to the outputs of each of the inverters. Such may be required if the individual transistors are fairly small in size. In a practical system, only some of the output drivers are configured as shown in FIG. 2. Other output drivers, particularly those transmitting critical signals, are configured conventionally. Such allows the critical signals to be transmitted promptly, while only the less critical signals are delayed somewhat by transmission through a set of staggered inverters.

The configuration of FIG. 2 succeeds in reducing the current slew rate caused by signals transmitted therethrough. However, one disadvantage of the arrangement of FIG. 3, is that the slew rate, once set, cannot be modified. In other words, during design of an IC incorporating the output driver of FIG. 3, the sizes and characteristics of the inverters and transistors must be determined. Often, however, it is not known during the design stage what the slew rate should be set to. For example, the speed of operation of components within integrated circuit are highly dependent upon temperature. Accordingly, if an IC is to be used in a low temperature environment, the output drivers will switch faster, resulting in higher noise. However, during the design stage, it may not be known whether the IC is to be used in a low temperature environment or not. Also, it is often not known what peripheral components the IC will be used in connection with. The peripheral components may affect the external load applied to the output buffers, and thereby affect the amount of voltage noise occurring for a given current slew rate. Also, ICs fabricated in accordance with a single design may be operated at different clock rates. For those with slow clock rates, less voltage noise is generated than ICs employed with higher clock rates. The amount of voltage noise may also depend upon the packaging of the IC or upon its form factor.

Because the environment, clock rate, packaging or form factor of an IC may not be known in advance, a system designer must "guess" or otherwise predict what amount of current slew rate reduction is required and design the IC accordingly. The designer must also allow for a sufficient noise margin in the event that the current slew rate reduction is not sufficient. Such can result in an overall IC configured to perform at a clock rate less than would otherwise be desired.

Accordingly, it would be desirable to provide a method and apparatus for controlling current slew rate within an output driver wherein the current slew rate can be set or modified subsequent to wafer fabrication, and perhaps subsequent to packaging of the wafer in an IC.

The parent application provided methods and apparatus for controlling the slew rate of an output driver. More specifically, a programmable means was set forth therein for selecting the slew rate of an output driver. In one embodiment, the programmable means included an array of flash-programmable elements connected to respective output driver transistors. Each flash-programmable element was configured to forward data to a corresponding output transistor device if the element was enabled (i.e., erased) and to not forward the signal if the flash element was not enabled (i.e., programmed). In this manner, the number of output drivers receiving the output signal is selectable based upon the programming of the flash-programmable elements. By programming the elements to all forward output signals to the output transistors, all the output transistors are triggered substantially simultaneously, and a collective slew rate for the output transistors is thereby relatively fast, resulting in a relatively large amount of signal noise. However, by programming the flash cells to route signals only to a few of the output transistors, then only the few transistors are triggered and the collective slew rate is relatively slow, resulting in relatively little noise in the output signal.

Although this arrangement has been found to be very effective, it would be desirable to provide alternative methods and apparatus for controlling the slew rate of output drivers and it is to that end that aspects of the present invention are drawn.

SUMMARY OF THE INVENTION

In accordance with the invention, a programmable means for selecting the current slew rate for output signals driven by an output driver of an integrated circuit chip is provided wherein the programmable means comprises a separate flash-programmable element connected to each of the plurality of transistor devices. Each of the separate flash elements receives a data signal along an input line and outputs the data signal subject to a time delay dependent upon the programming of the flash element. In one embodiment, some of the flash elements are programmed to forward the data signal to the respective output transistor with little or no significant delay. Others are programmed to output the data signal to the corresponding output transistor with a greater amounts of delay. As a result, the various output transistors receive the data signal at differing times. Hence, the output transistors are triggered at differing times causing the output signal to be driven, as a whole, over a longer period of time than if all output transistors were triggered simultaneously. By triggered the output transistors at slightly different times, the current drawn by the output transistors is also spread out somewhat over time thereby reducing any sharp spike in the rate of change of current with time which might otherwise occur if all output transistors were triggered simultaneously. Thus, the time rate of change of current (dI/dt), i.e., the current slew rate, is reduced and the amount of noise is therefore also reduced.

DETAILED DESCRIPTION OF EXEMPLARY EMBODIMENTS OF THE INVENTION

Referring to the Figures, exemplary embodiments of the invention will be described. The exemplary embodiments will primarily be described with reference to block diagrams and circuit schematics illustrating important components of the invention. A practical system may require additional components not described or illustrated herein. The additional components are not described or illustrated because those components are not necessary for an understanding of the principles of the invention. Moreover, the internal configuration or fabrication of the various components described herein will not typically be set forth, as such components can be configured and fabricated in accordance with conventional techniques or in accordance with the teachings provided herein.

With reference to FIG. 4–7, exemplary embodiments of the invention originally set forth in the above-identified parent application will be described. Then, with reference to the remaining figures, new alternative embodiments of the invention will be described.

Exemplary Embodiments

Figure 4:
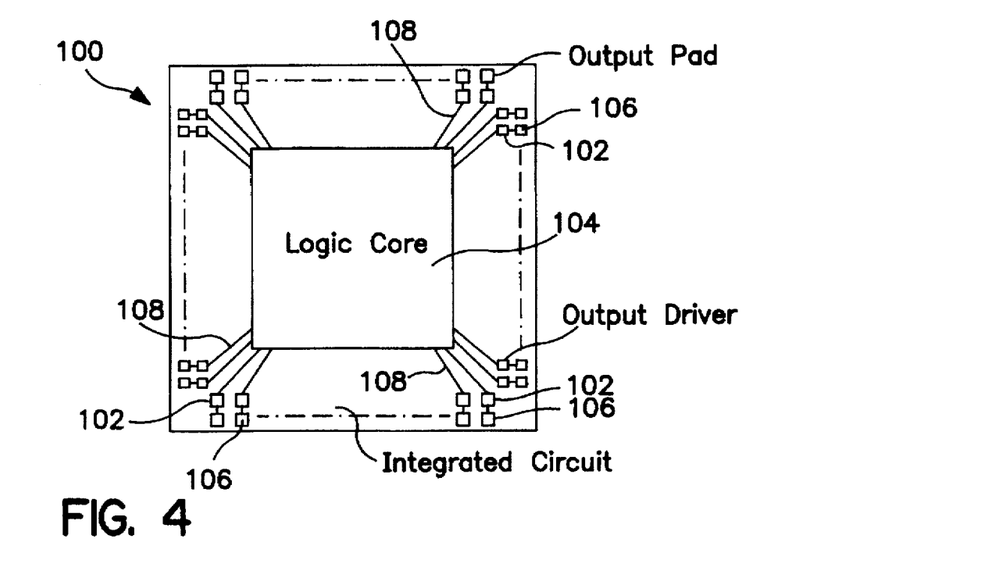
FIG. 4 is block diagram illustrating an integrated circuit having output drivers configured in accordance with principles of the invention.

FIG. 4 illustrates an integrated circuit 100 having a set of output drivers 102 interconnecting a core logic unit 104 and a set of output pads 106. Each output driver 102 is connected along a separate output line 108 connecting the core logic unit to the respective output pad. Although not separately shown in FIG. 4, integrated circuit 100 may be mounted within a package or other suitable module and interconnected to external components either directly or through a bus. Integrated circuit 100 may form part of a computer system or other system incorporating integrated circuits.

Figure 5:
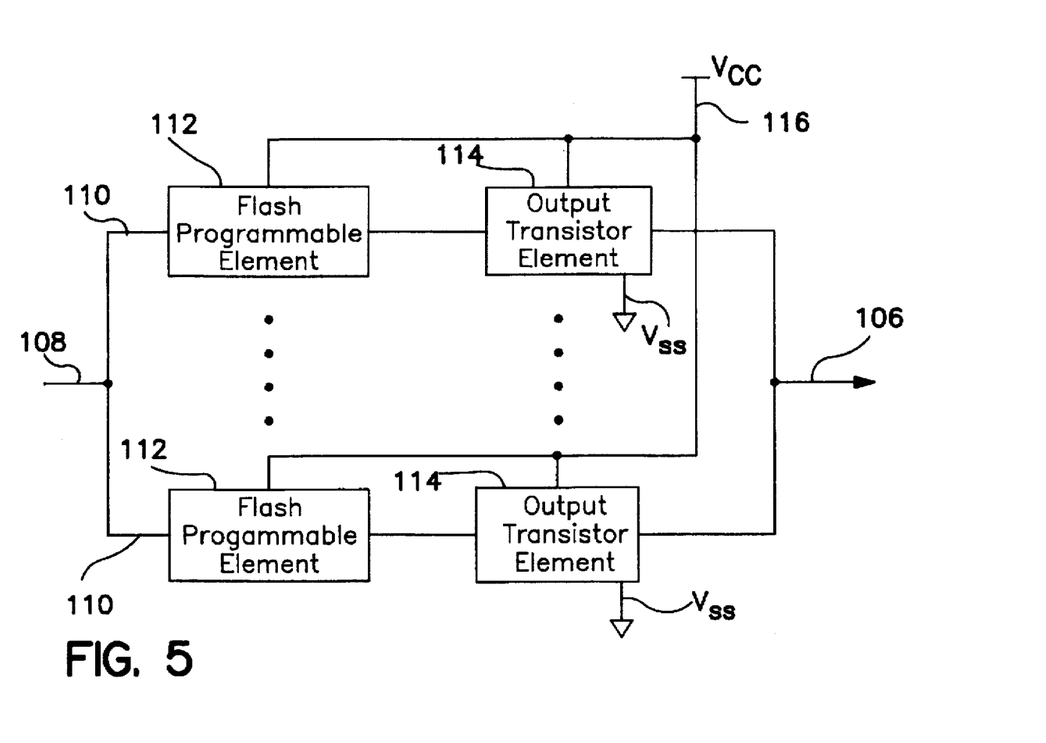
FIG. 5 is block diagram illustrating one of the output drivers of the integrated circuit of FIG. 4.

FIG. 5 illustrates one of the output drivers of FIG. 4. The output driver receives signals to be output along line 108 which is split into a set of N individual lines 110. A flash-programmable element 112 and an output transistor driver element 114 are connected along each individual line 110. Each transistor driver element 114 is connected to a high voltage power source 116. The flash-programmable element is also connected to the high voltage power source.

Each flash-programmable element 112 effectively operates as a switch which passes the output signal to the corresponding transistor driver element 114, if enabled or programmed, or does not transmit the signal, otherwise. Each output transistor element 114 operates to draw current while outputting a signal to pad 106 if a signal is received from the corresponding flash-programmable element 112 and draws no current, otherwise. The output signal ultimately transmitted to pad 106 is the combined output signals from each of the output transistor elements 114 receiving output signals from corresponding flash-programmable elements 112. Depending upon the implementation, each output transistor element may include a complimentary arrangement of P-channel and N-channel devices. The P-channel devices operate to draw current from power supply 116. The N-channel devices operate to draw current from the output pin (connected to line 106) to ground. In other implementations, some of the output transistor elements may include only P-channel devices and some may include only N-channel devices. Collectively, the number of P-channel devices need not be equal to the number of N-channel devices. For generality, within FIG. 5, each output transistor element is shown connected to both a $V_{CC}$ power supply 116 and a $V_{SS}$ ground.

In use, a selected number of flash-programmable elements 112 are programmed or enabled to allow the output signal to pass there through. The flash-programmable elements may be programmed by conventional means such as by hot electron injection. Thereafter, an output signal received along line 108 is transmitted only through those flash-programmable elements that are enabled. Accordingly, only corresponding output drivers receive and drive the output signal to pad 106 by drawing current. If all or most programmable elements 112 are enabled, then all or most of the output drivers operate, substantially simultaneously, to draw current from and drive the output signal to pad 106. As a result, a significant time rate of change in current drawn from the power supply occurs, and the resulting output signal may be subject to significant voltage noise. Other output signals transmitted simultaneously through other output drivers may also be subject to the significant amount of voltage noise. However, because all or most output transistor elements of driver 102 are operating in parallel, a minimum sufficient of current is quickly drawn, allowing the output signal to be quickly driven to pad 106. Hence, fast throughput is achieved, although at the expense of increased voltage noise. If only one or a few of the flash-programmable elements 112 are enabled, then the output signal is received by only a few of the output transistor elements. Because only one or a few of the transistor elements operate, it takes longer for the minimum sufficient amount of charge to be drawn to drive the output signal to pad 106. As such, the time rate of change of current drawn is comparatively slow and the voltage noise level is thereby reduced. However, because only one or a few of the output transistor drivers are operating simultaneously, the output signal is driven to pad 116 more slowly, resulting in generally slower signal transmission throughput.

As noted, integrated circuit 100 of FIG. 4 includes one output driver for each output line. Each of the output drivers may be configured as illustrated in FIG. 5 or some may be otherwise conventional output drivers. For each output driver configured with flash-programmable elements, either one, some or all of the elements may be enabled to select the transmission rate/voltage noise contribution level for that output driver. For example, the output drivers connected to critical signal pads may be flash-programmed to achieve maximum transmission rates, while contributing significant voltage noise. Output drivers connected to non-critical signal pads may be flash-programmed to provide slower transmission rates while contributing less voltage noise. In this manner, the voltage noise contributed by critical signal paths is offset by noise reduction achieved for non-critical signal paths.

Flash-programming of the individual output drivers is performed subsequent to fabrication of the integrated circuit incorporating the output drivers, and perhaps subsequent to product test. (It is, however, also possible to set the programming state of the flash cells during fabrication.) In practical implementations, actual programming of the flash elements is deferred until the environment into which the wafer is to be placed has been determined. The environment includes the particular packaging into which the wafer is mounted, and the peripheral components connected to the wafer, such as the specific bus interconnection system. The environment also includes the clock rate and form factor of the IC. Each of these factors, as well as other factors, may affect the amount of voltage noise generated by each output driver and may affect the total amount of acceptable voltage noise. Once the environment is determined, the flash-programmable elements of the various output drivers are selectively programmed to achieve desired performance characteristics, such as maximum output rates, while remaining within maximum permissible voltage noise levels.

Figure 6:
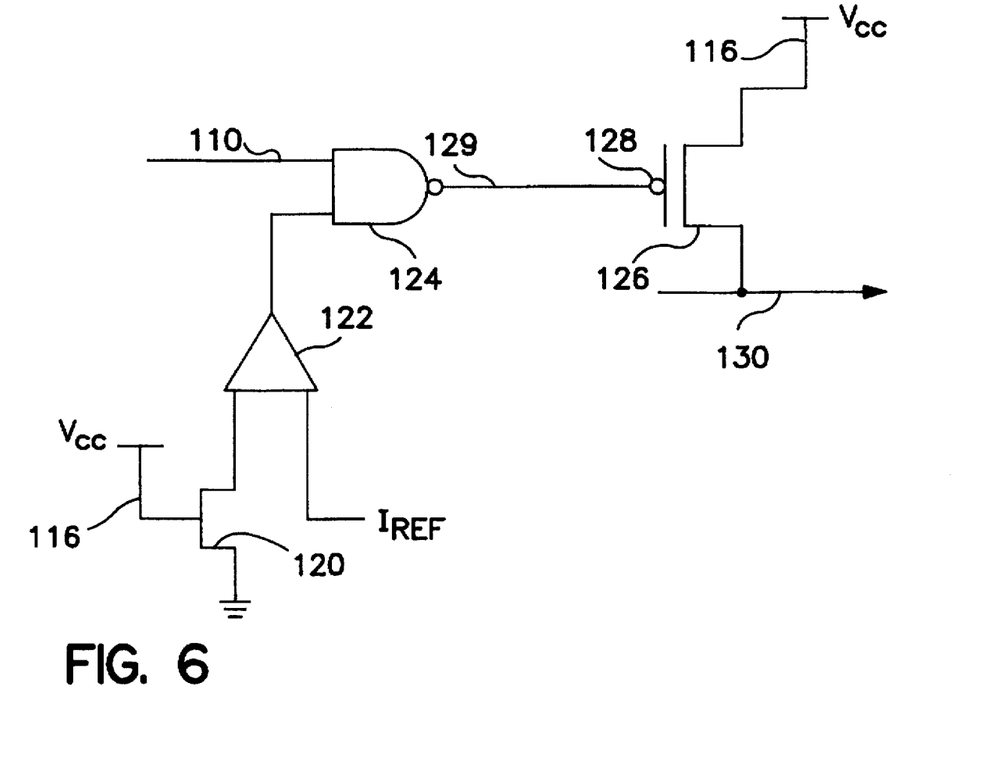
FIG. 6 is a schematic illustration of a flash-programmable element of the output driver of FIG. 5 and corresponding output transistors.

FIG. 6 illustrates an exemplary implementation of one of the programmable elements of FIG. 5. Programmable element 112 of FIG. 6 includes a flash cell 120, a 2-input sense amplifier 122 and a 2-input AND gate 124. A gate of flash cell 120 is connected to the high voltage power supply 116 under normal or non-programming operation. (The gate is alternatively connected to a very high voltage to program the flash cell.) A source of the flash cell is connected as one of the inputs of sense amplifier 122 and a drain of the flash cell is connected to ground. The second input of sense amplifier 122 receives a current reference signal $I_{ref}$. In other implementations, a voltage reference signal may alternatively be employed. A NAND gate 124 receives the input signal along line 110 and an output of sense amplifier 122. The output of NAND gate 124 is connected into a corresponding PMOS transistor 126 of output transistor element 114 (FIG. 5).

With this configuration, NAND gate 124 outputs the input signal received along line 120, inverted, if flash cell 120 is enabled or programmed, and outputs a constant high voltage signal otherwise. More specifically, if the flash cell 120 is enabled, the flash cell does not allow current to flow. Hence, sense amplifier 122 detects different currents on its two inputs, and therefore outputs a low voltage signal to NAND gate 124. Hence, NAND gate 124 outputs a high voltage signal, regardless of the input along line 110. If the flash cell 120 is enabled, then the flash cell operates as a (NMOS) transistor allowing current to flow. Hence, sense amplifier 122 detects equal currents on both inputs, and outputs a high voltage signal to the NAND gate. The NAND gate, then outputs a low voltage signal if the input along line 110 is high and a high voltage signal otherwise. In other words, NAND gate 124 outputs the input signal inverted.

As noted, FIG. 6 also illustrates an output PMOS transistor 126 corresponding to a portion of the corresponding output transistor element 114 (FIG. 5). The output of NAND gate 124 is applied to a gate 128 of PMOS transistor 126 via line 129. A source of the PMOS transistor is connected to the high voltage power source 116 (FIG. 5). The drain of the PMOS transistor is connected to an output line 130 connected to output pad 106 (also FIG. 5). Hence, if flash cell 120 is not enabled or programmed, gate 128 receives a constant high voltage signal, and hence does not draw any current from the power source. If flash cell 120 is enabled or programmed, then gate 128 receives the output signal inverted and pulls up the output line 130 whenever the output signal is low. Hence, current is drawn from the high voltage current supply.

Although not separately shown in FIG. 6, for the complimentary implementation, output transistor element 114 also includes an NMOS transistor connected in series with PMOS transistor 126. Likewise, flash-programmable element 112 includes a second set of components, including a second flash cell, sense amplifier and AND gate, interconnected to the gate of the NMOS transistor. In other words, a mirror image of the PMOS transistor/flash cell configuration is provided with AND instead of NAND. With this arrangement, the NMOS transistor receives a constant low voltage signal if the corresponding flash cell is enabled, and the inverted output signal, otherwise. As such, the NMOS transistor is not enabled and does not draw any current if the corresponding flash cell is disabled. If the corresponding flash cell is not enabled, then the NMOS transistor pulls down the voltage on output line 130 upon receiving a high voltage signal from the corresponding AND gate.

Hence, for the complimentary implementation the PMOS and NMOS transistors pull up or pull down (respectively) the voltage on output line 130 in accordance with the output signal, but only if the flash cells of the corresponding flash-programmable element are enabled. The net result of the operation of the pair of PMOS and NMOS transistors is to re-invert the output signal.

Figure 7:
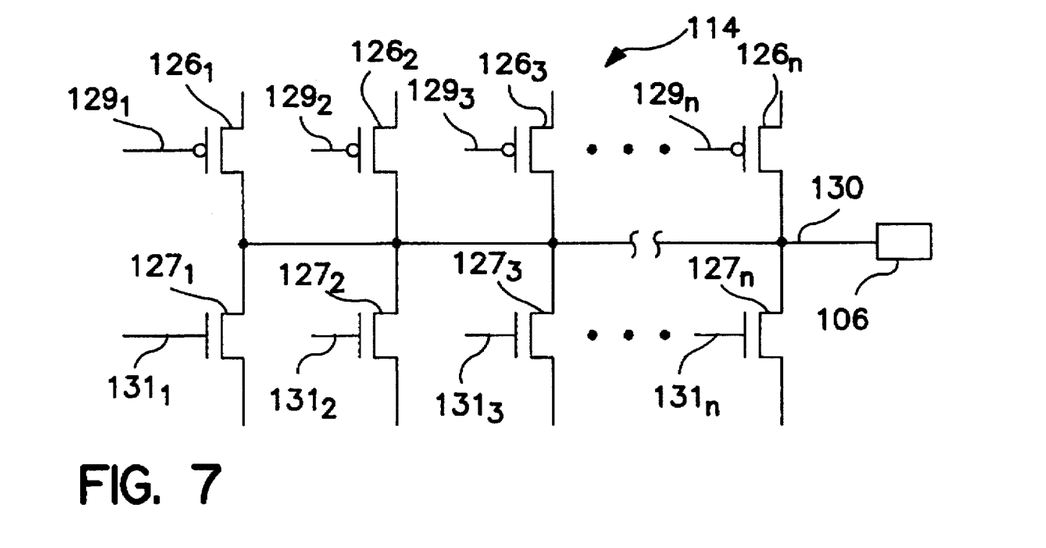
FIG. 7 is circuit schematic illustrating a set of output transistor elements for use with the output driver of FIG. 5.

FIG. 7 illustrates the PMOS and NMOS transistors for each of an entire set of output transistor elements 114 for the complimentary implementation, each interconnected to the single output line 130 connected to output pad 106. PMOS transistor elements are identified by reference 126 with subscripts, i.e., $126_1$, $126_2$ ... $126_N$. Each individual PMOS transistor is connected through a separate connection line 129, with corresponding subscript, to a corresponding flash cell (FIG. 6). NMOS transistor elements are represented by reference 127, with appropriate subscripts, and each is connected through a separate interconnection line 131, also subscripted, to a corresponding flash cell. Hence, N pairs of output transistors are provided, each connected to a corresponding pair of flash cells. With this configuration, the output signal transmitted to pad 106 represents the sum of the output signals driven by each of the pairs of PMOS and NMOS transistors. As noted, depending upon the flash-programming of the corresponding programmable elements, only a subset of the total number of PMOS and NMOS transistors may receive the output signal. At minimum, at least one such pair of PMOS and NMOS transistors must receive the output signal, to thereby allow the output signal to be transmitted to pad 106. At most, all N pairs receive output signals.

What has been described thus far is an output driver employing a flash-programmable elements for use in setting or selecting the overall current slew rate to thereby set or select the amount of voltage noise. In other embodiments, other techniques may be employed for implementing the programmable element. For example, electrically erasable and programmable read only memory (EEPROM) or EPROM elements may be employed. Indeed, in general, any technique for permanently or semi-permanently programming the programmable elements may be employed. In still other embodiments, the programmable elements may be interconnected to logic elements which allow the slew rate to be controlled during the operation of the integrated circuit, perhaps under the control of programs running within the core of the integrated circuit.

Additional Embodiments

Referring to the remaining figures, alternative embodiments for the output driver will be described wherein threshold voltage levels of flash programmable elements are selectively programmed to provide differing amounts of delay to a signal transmitted to thereby trigger the output transistors sequentially, rather than simultaneously. In other words, whereas the embodiments described above with reference to FIGS. 4-7 relate to the programming of flash cells to control whether a signal is transmitted to corresponding output transistors, the embodiments of the remaining figures relate to the programming of the flash cells to vary the time delay of signals passing through the flash cells.

Figure 8:
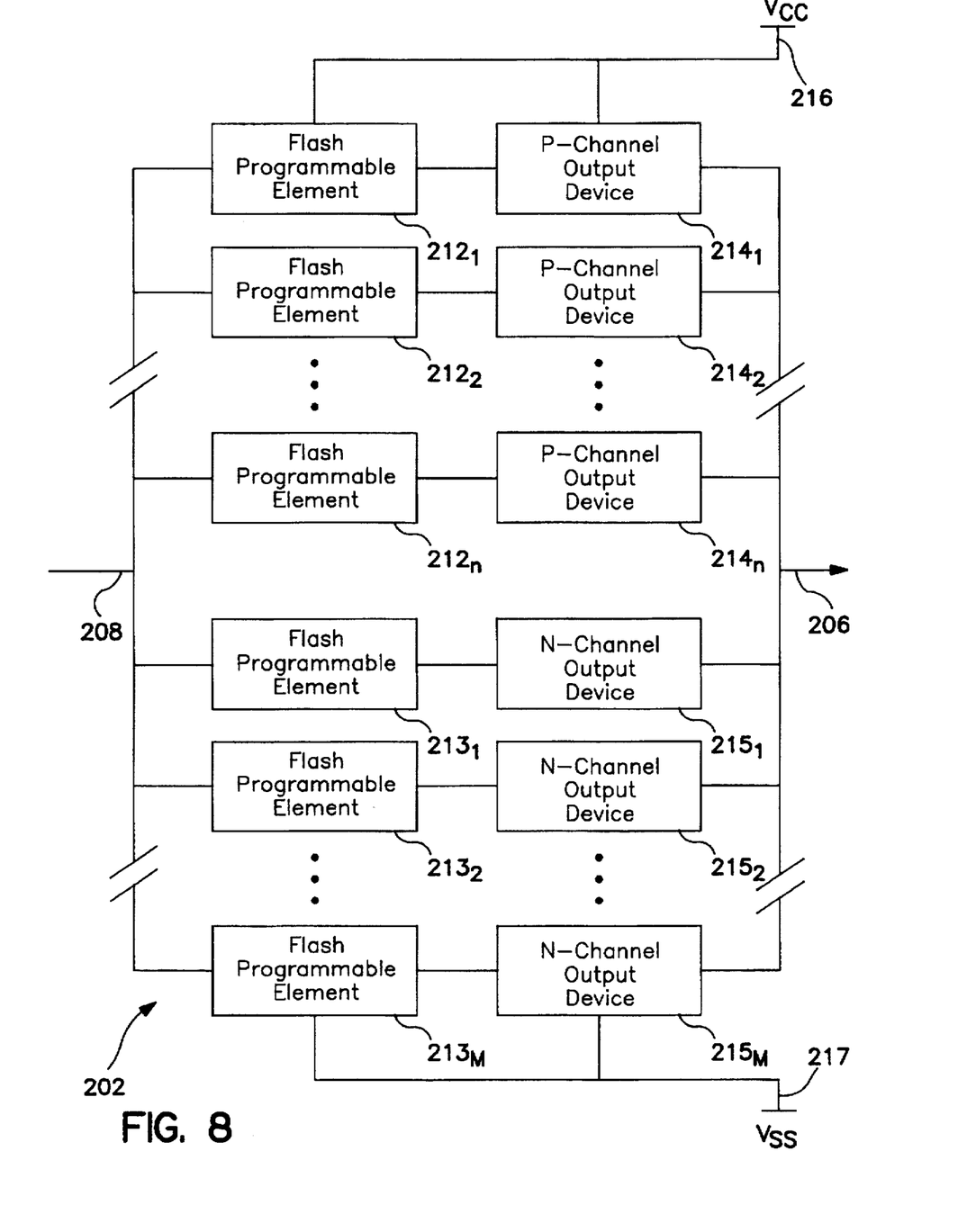
FIG. 8 is a block diagram illustrating an alternative configuration for one of the output drivers of the integrated circuit of FIG. 4.

Referring first to FIG. 8, an output driver 202 is illustrated which may be employed within the integrated circuit of FIG. 4 as an output driver 102. Driver 202, of FIG. 4, receives input signals along a line 208 and outputs the signals along a line 206 to an output pad (not shown in FIG. 8). The output driver includes a first set of N flash programmable elements $212_1$–$212_N$ which are connected in parallel between input line 208 and respective P-channel output transistor elements $214_1$–$214_N$. The output driver also includes a second set of M flash programmable elements $213_1$–$213_M$ connected in parallel between input line 208 and respective N-channel output transistor elements $215_1$–$215_M$. N and M may differ, i.e., the number of P-channel output transistor elements may differ from the number of N channel output transistor elements. Each of the various flash programmable elements and output transistor elements are connected between a $V_{CC}$ high voltage 216 and a $V_{SS}$ low voltage 217.

Thus, output driver 202 includes pairs or "legs" of flash elements and output elements connected in parallel. Prior to use, the voltage thresholds of flash transistors within flash elements 212 and 213 are programmed to selectively set an amount of time delay occurring within the flash elements for signals received along line 208 for transmission to respective P-channel or N-channel output elements. By setting a flash element to a relatively high threshold voltage, a relatively large delay will occur within the flash element. By setting a flash element with a relatively low voltage threshold, a relatively small amount of delay will occur. Accordingly, with a large delay, the corresponding output element is triggered later in time than with a shorter delay.

In one embodiment, the flash programmable elements are programmed with successively increasing threshold voltages to therefore provide successively increasing amounts of delays to signals transmitted to the corresponding output elements. Accordingly, the output elements are triggered sequentially allowing current to be drawn from $V_{CC}$ 216 in successively greater amounts over a period of time resulting in a relatively low value for dI/dt. By providing a relatively low value for dI/dt, the total amount of noise contributed by the output driver is reduced over what would otherwise occur if all of the output transistor elements were triggered simultaneously.

Thus, in the exemplary embodiment, the flash programmable elements are programmed to cause the triggering of the corresponding output transistors to be staggered in time. In other embodiments, the flash programmable elements may all be programmed to ensure that the corresponding output transistors are triggered substantially simultaneously to achieve faster throughput of the output signals, although at the expense of increased noise as a consequence of an increased current slew rate caused by the output transistors triggered substantially simultaneously. In still other embodiments, it may be desirable to program some of the flash elements to completely prevent the output signal from being forwarded to corresponding output transistors thereby reducing the number of output transistors operating. As can be appreciated, a wide range of programming options may be employed consistent with the principles of the invention.

Figure 9:
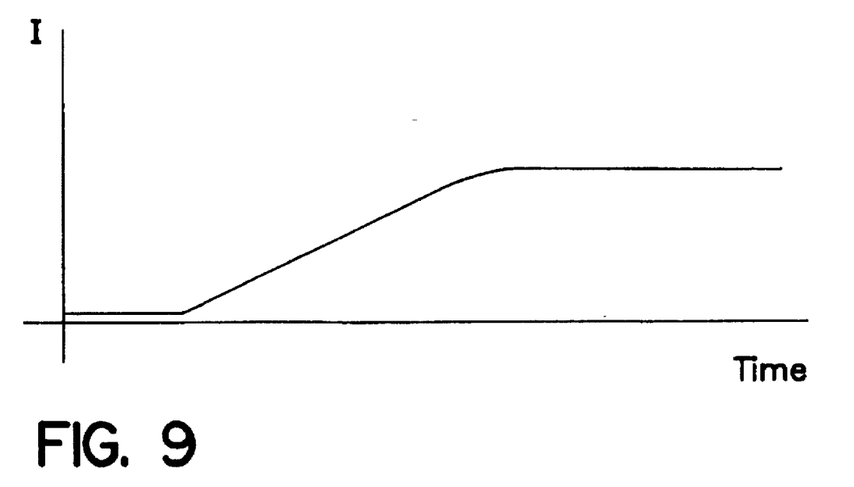
FIG. 9 is a graph illustrating the time rate of change of current (dI/dt) drawn by the output driver of FIG. 8 subject to incremental programming of flash elements of the output driver.

FIG. 9 illustrates the amount of current drawn by the output driver of FIG. 8 as a function of time (in arbitrary units) for an arrangement wherein the flash elements are programmed to trigger the corresponding output elements sequentially with about equal differences in time delays between the output elements. As can be seen, the current drawn by the driver increases gradually, with a relatively constant slope, until all output elements have been triggered. Thereafter, the current draw remains constant until the output driver is de-activated and the output line is eventually pulled down (not shown).

Figure 10:
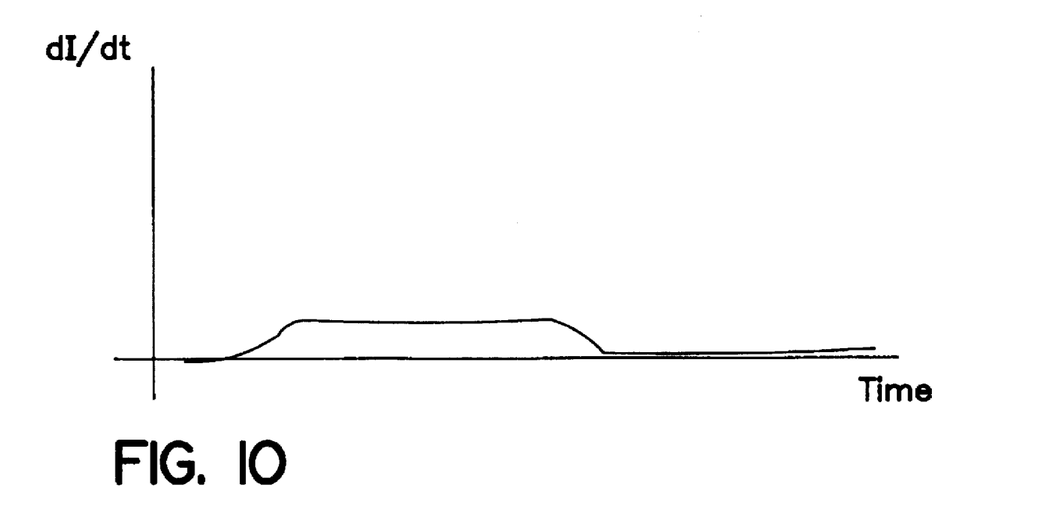
FIG. 10 is a graph illustrating dI/dt as a function of time corresponding to the graph of FIG. 9.

FIG. 10 illustrates dI/dt as a function of time in arbitrary units for the same flash programming arrangement as with FIG. 9. In other words, FIG. 10 illustrates the time rate of change of current as a function of time. As can be seen, following activation of the output driver, dI/dt remains substantially constant, until decreasing to about zero after all of the output elements have been activated. This should be contrasted with a fairly large dI/dt spike which would otherwise occur if all output elements were triggered substantially at the same time. With such a spike, the maximum dI/dt achieved would be significantly higher than the maximum shown within FIG. 9. Although not shown within FIG. 9, dI/dt will again increase above zero when the output driver is de-activated and current draw reduces from its maximum value to zero. To prevent a significant amount of noise from occurring at that time, it may be desirable to pull down the output line slowly to allow the current drawn by the output elements to be reduced gradually as well. Although not separately shown, in some implementations it may be desirable to position an inverter between the flash elements and output elements of FIG. 8 to cause output elements to be turned off sequentially, rather than turned on. As a result, given the same programming of the flash elements, the amount of current drawn through the output elements will decrease gradually with time, rather than increase gradually. Nevertheless, the curve for dI/dt will remain substantially the same as that shown in FIG. 10 resulting in a similar reduction in dI/dt-related noise.

Figure 11:
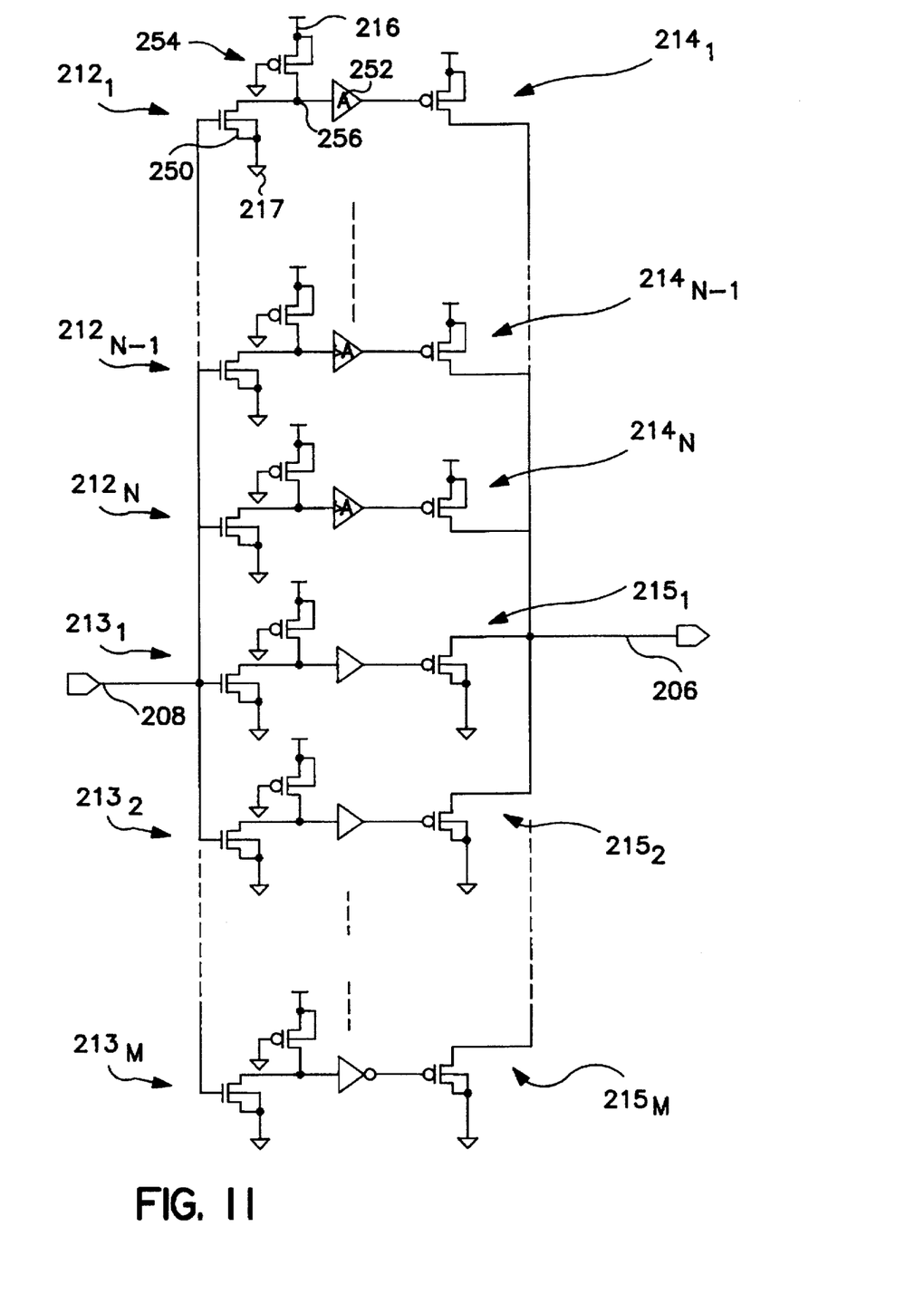
FIG. 11 is a circuit schematic illustrating a specific exemplary embodiment of the output driver of FIG. 8.

In one specific arrangement, shown in FIG. 11, each flash element includes a flash cell transistor 250, a buffer 252, and a biasing circuit 254. A gate of the flash cell transistor is connected to input line 208, a source is connected to a ground and a drain is connected to a node 256 interconnecting the biasing circuit and an input to the buffer. An output of the buffer is connected to a respective output transistor device 214 or 215. The biasing circuit interconnects the node to high voltage source 216 to pull up the voltage, if needed, following operation of the flash cell transistor.

The flash cell transistor is operated at a variable threshold voltage, hereinafter referred to as $V_t$. Slight programming of the flash cell causes the $V_t$ for that cell to rise. This "soft programming" of the flash cell raises the $V_t$ of the cell above its "erased" value but still well below what ordinarily would be considered "programmed" for digital logic. In one example, normal "erase" $V_t$ for the flash cell is about 1.5 V. Normal "programmed" $V_t$ for the cell is about 6.5 V. Soft programming of the cell is performed within the range of 1.5 V to 6.5 V. By adjusting $V_t$ within that range, the speed of triggering of the cell is adjusted to achieve the above-described effects in the propagation of the signal to the respective output transistor.

Alternatively, the flash cells are programmed with a negative $V_t$, wherein the flash cell $V_t$ is adjusted, not by soft programming, but rather by over-erase. As such, more electrons are tunneled off of a floating gate of the flash cell than would occur under thermal equilibrium conditions, hence providing a lower $V_t$ than at equilibrium. This converts the flash cell into a normally-on (depletion-mode) device wherein negative gate voltages are required to turn the cell off. Charge pumps (not shown), or similar devices, are employed to achieve the negative voltages. The provision of over-erased flash cells with a negative $V_t$ allows inverse slew control wherein all output transistors are initially on, then are shut off at a rate determined by the relative programming of the flash cells. In one example, the output transistors are shut off sequentially. To allow the output transistors to be turned on sequentially, an inverter, not shown, may be positioned between each buffer 252 and its corresponding output transistor. In still other arrangements, the buffer itself may be replaced with a suitable inverter.

In any case, programming the flash cell with a negative $V_t$ results, in some circumstances, in an even greater reduction in noise. A flash cell amplifies any noise coupled to it and adds the noise to signals transmitted therethrough. The amount of noise depends upon a difference between the threshold voltage for the flash cell and a switching voltage for the flash cell. This noise should be distinguished from the dI/dt noise described above. In a 3.3 volt system, the switching voltage for the flash cell may be about 1.6 volts. The threshold voltage $V_t$ cannot be set any lower than zero volts resulting in only a 1.6 volt differential therebetween. However, by providing a negative threshold voltage, the differential increases. For example, if the threshold voltage is set to a value of −2 volts, then the differential between the threshold voltage and the switching voltage is about 3.6 volts resulting in greater noise immunity. Accordingly, the amount of noise generated by the flash cell is further reduced at least in circumstances where noise is initially coupled into the flash cell. This additional reduction in noise is in addition to noise reduction gained by reducing dI/dt by selectively varying the negative voltages from one cell to another.

Regardless of whether soft-programming or over-erase is employed, after the integrated circuit having the flash-programmable output drivers is fabricated, flash elements are programmed to reduce the overall current slew rate by an amount sufficient to reduce the overall voltage noise level to an acceptable amount depending on the specific environment in which the chip is to be used. Thus, if the chip is intended to be used in a low temperature environment, the flash elements may be programmed to reduce the overall current slew rate to compensate for increased transmission rates resulting from the low temperatures. As another example, the flash elements may be programmed, depending upon the specific package into which the IC is mounted, to maximize signal transmission output rates while maintaining an acceptable voltage noise level. Hence, the selection of the relative time delay to be used within each output driver may be deferred until the environment of the integrated circuit is known. At that time, the flash elements are programmed to achieve maximum propagation rates of output signals while maintaining an acceptable voltage noise level.

Figure 12:
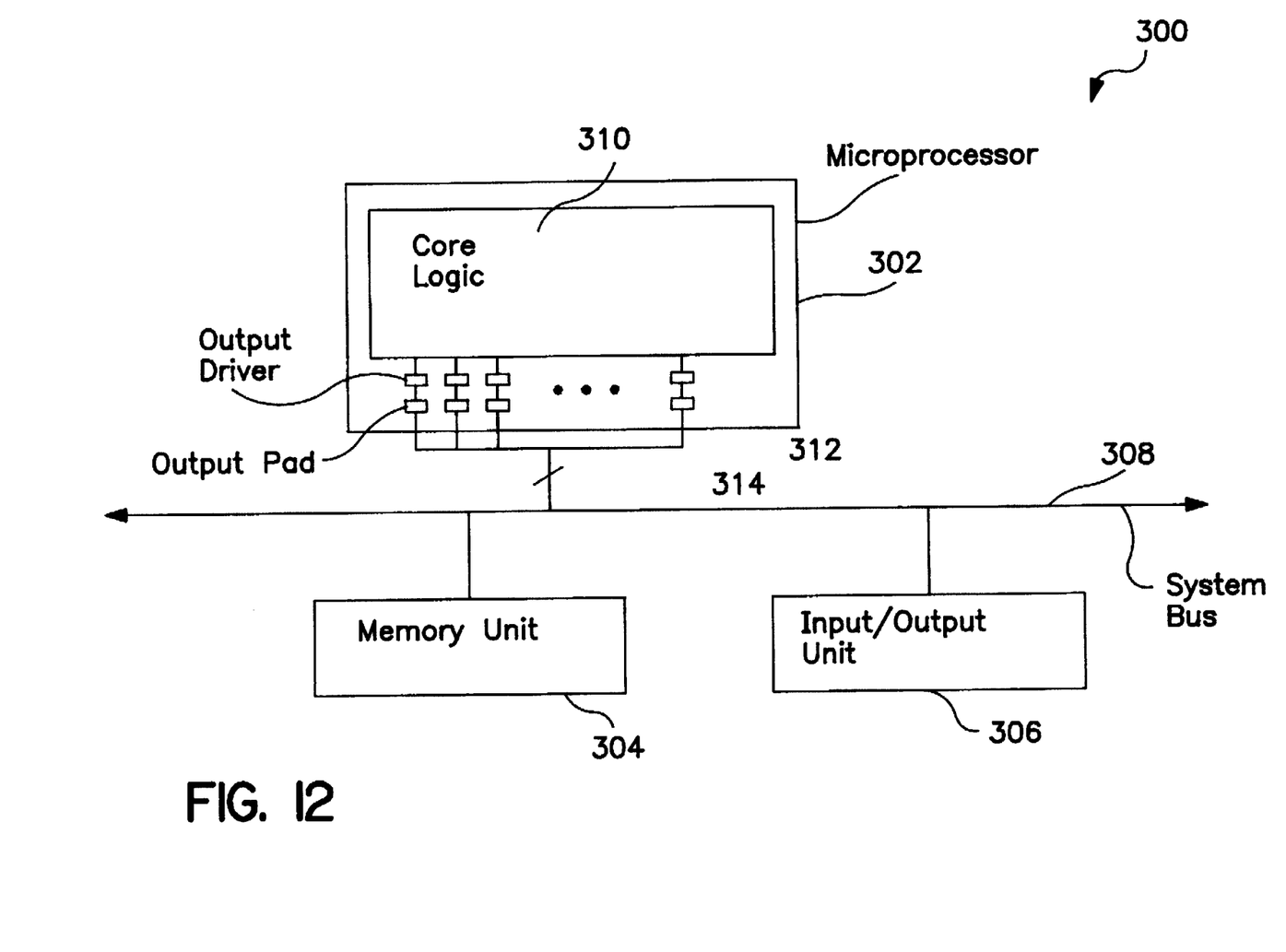
FIG. 12 is a block diagram of a computer system having an IC incorporating one or more of the output drivers of FIGS. 4–11.

FIG. 12 illustrates a computer system 300 having a microprocessor 302, a memory unit 304 and an input/output unit 306 all interconnected by a system bus line 308. Microprocessor 302 includes a core logic unit 310 and a set of output drivers 312 and corresponding output pads 314. The output drivers and corresponding output pads operate to output signals from core 310 to bus 308 for transmission to memory unit 304, input/output unit 306, or any other components connected to the bus. The individual output drivers are configured in accordance with any of the embodiments described above with reference to FIGS. 4-11. For example, some may be configured as described with reference to FIGS. 5-7. Others may be configured as described with reference to FIGS. 8-11. In other implementations, all may be configured in accordance with one embodiment or the other. In any case, the slew rates of the various output drivers are programmed to achieve a desired voltage noise level. Although not separately shown, memory unit 304, input/output unit 306 or any other components connected to the system bus may also include output drivers configured in accordance with the principles of the invention.

Thus, various embodiments of output drivers for use in integrated circuits have been described wherein the slew rate of current drawn by the output driver may be reduced with appropriate programming of flash elements. The embodiments described herein are merely illustrative of the invention and should not be construed as limiting the scope of the invention. As such, the invention may be implemented in different embodiments for use in different applications both to achieve the goals and objectives described herein as well as other goals and objectives.

What is claimed is:

1. In an output driver for outputting signals, subject to a current change slew rate, from an integrated circuit chip wherein the output driver includes a plurality of transistor devices connected to an output line, an improvement comprising:

programmable means for selecting the slew rate for output signals driven by the output driver, said programmable means including a separate flash-programmable element connected to each respective transistor device, with each of said separate flash-programmable elements configured to receive a data signal along an input line and output the data signal to the respective transistor device subject to a delay dependent upon a degree of programming of the flash element.

2. The improvement of claim 1 wherein each flash element comprises:

a flash cell transistor having a gate connected to the input line, a source connected to a ground, and a drain;

a buffer having an input connected to the drain of the flash cell and an output connected to a respective output transistor device; and a circuit for biasing a node interconnecting the drain of the flash cell transistor and the input of the amplifier to a predetermined voltage level.

3. The improvement of claim 2 wherein the output driver operates between a high voltage $V_{CC}$ and a low voltage $V_{SS}$ and wherein the flash cell transistor has a threshold voltage set between the $V_{CC}$ and $V_{SS}$.

4. The improvement of claim 2 wherein the output driver operates between a high voltage $V_{CC}$ and a low voltage $V_{SS}$ and wherein the flash cell transistor has a threshold voltage set below $V_{SS}$.

5. An output driver having a programmable slew rate for use on an integrated circuit, said output driver comprising:

a data line for providing data to be output from the integrated circuit to the system bus;

a plurality of output driver transistor devices each having an output connected to a common output pad; and a plurality of programmable flash devices, with each flash device connected between the data line and an input of a respective one of the output transistor devices, with each said flash device outputting a data signal provided by the data line subject to a delay dependent upon a degree of programming of the flash device such that individual ones of the plurality of output driver transistor devices can receive output signals at differing times.

6. The output driver of claim 5 wherein each flash element comprises:

a flash cell transistor having a gate connected to the input line, a source connected to a ground, and a drain;

a buffer having an input connected to the drain of the flash cell and an output connected to a respective output transistor device; and a circuit for biasing a node interconnecting the drain of the flash cell transistor and the input of the amplifier to a predetermined voltage level.

7. The output driver of claim 6 wherein the output driver operates between a high voltage $V_{CC}$ and a low voltage $V_{SS}$ and wherein the flash cell transistor has a threshold voltage set between the $V_{CC}$ and $V_{SS}$.

8. The output driver of claim 6 wherein the output driver operates between a high voltage $V_{CC}$ and a low voltage $V_{SS}$ and wherein the flash cell transistor has a threshold voltage set below $V_{SS}$.

9. The output driver of claim 5 wherein the plurality of output driver transistor devices includes a first plurality of P-MOS transistors and a second plurality of N-MOS transistors, with gates of the P-MOS and N-MOS transistors connected to outputs of sense amplifiers of separate respective flash devices.

10. The output driver of claim 6 wherein the circuit for biasing the voltage comprises a P-MOS transistor having a gate connected to a ground, a source connected to a high voltage source, a drain connected to the node, and a feedback path connected from the source to a substrate of the transistor.

11. For use in an output driver of an integrated circuit wherein the output driver includes a data line for providing data, a plurality of output transistor devices each having an output connected to a common output pad, and a plurality of programmable flash devices with each device connected between the data line and an input of a respective one of the output transistor devices, a method comprising the steps of:

selectively programming the flash devices to provide differing amounts of delay to a received data signal; and routing a data signal in parallel through the flash devices such that the respective output transistor devices receive versions of the signal subject to differing delays.

12. The method of claim 11 wherein the step of selectively programming the flash devices is formed to provide incrementally differing threshold voltages.

13. The method of claim 12 wherein the threshold voltages are set to provide a substantially equal differential in threshold voltage between flash devices such that the signal is incrementally delayed by substantially equal amounts of time delay.

14. The method of claim 11 wherein the output driver operates between a high voltage of $V_{CC}$ and a low voltage of $V_{SS}$ and wherein the step of selectively programming the flash devices is performed to provide threshold voltages between $V_{CC}$ and $V_{SS}$.

15. The method of claim 11 wherein the output driver operates between a high voltage of $V_{CC}$ and a low voltage of $V_{SS}$ and wherein the step of selectively programming the flash devices is performed to provide threshold voltages below $V_{SS}$.

16. A method for selecting the slew rate of an output driver for use on an integrated circuit, said method comprising the steps of:

fabricating in integrated circuit having output transistors connected to flash programmable cells with the flash programmable cells configured to control an amount of time delay occurring before reception of an output signal by a respective output transistor;

determining a permissible voltage noise level for the integrated circuit; and programming a selected portion of the flash programmable cells to provide selected amounts of time delay for reception of output signals by respective output transistors to maintain the voltage noise level within the permissible voltage noise level.

17. A computer system comprising:

a microprocessor, a memory unit and a input/output unit; and a system bus interconnecting the microprocessor, memory unit and input/output unit, wherein the microprocessor includes an integrated circuit having an output driver including a data line for providing data to be output from the integrated circuit to the system bus, a plurality of output driver transistor devices each having an output connected to a common output pad, and a plurality of programmable flash devices, with each flash device connected between the data line and an input of a respective one of the output transistor devices, with each said flash device outputting a data signal provided by the data line subject to a delay dependent upon a degree of programming of the flash device such that individual ones of the plurality of output driver transistor devices can receive output signals at differing times.

* * * * *